United States Patent
Qian et al.

(10) Patent No.: US 9,216,489 B2
(45) Date of Patent: *Dec. 22, 2015

(54) CHEMICAL MECHANICAL POLISHING PAD WITH ENDPOINT DETECTION WINDOW

(71) Applicants: Rohm and Haas Electronic Materials CMP Holdings, Inc., Newark, DE (US); Dow Global Technologies LLC, Midland, MI (US)

(72) Inventors: Bainian Qian, Newark, DE (US); Marty W. DeGroot, Middletown, DE (US)

(73) Assignees: Rohm and Haas Electronic Materials CMP Holdings, Inc., Newark, DE (US); Dow Global Technologies LLC, Midland, MI (US)

( * ) Notice: Subject to any disclaimer, the term of this patent is extended or adjusted under 35 U.S.C. 154(b) by 70 days.

This patent is subject to a terminal disclaimer.

(21) Appl. No.: 14/228,613

(22) Filed: Mar. 28, 2014

(65) Prior Publication Data

US 2015/0273651 A1    Oct. 1, 2015

(51) Int. Cl.

| | |
|---|---|
| B24B 37/20 | (2012.01) |
| H01F 41/00 | (2006.01) |
| H01L 21/306 | (2006.01) |
| G02B 1/12 | (2006.01) |
| B24B 37/013 | (2012.01) |
| B24B 49/12 | (2006.01) |

(52) U.S. Cl.
CPC ............ *B24B 37/205* (2013.01); *B24B 37/013* (2013.01); *B24B 49/12* (2013.01); *G02B 1/12* (2013.01); *H01F 41/00* (2013.01); *H01L 21/30625* (2013.01); *Y10T 29/49826* (2015.01)

(58) Field of Classification Search
None
See application file for complete search history.

(56) References Cited

U.S. PATENT DOCUMENTS

| | | | |
|---|---|---|---|
| 6,171,181 B1 | 1/2001 | Roberts et al. | |
| 6,387,312 B1 * | 5/2002 | Roberts et al. | 264/328.16 |
| 6,641,471 B1 * | 11/2003 | Pinheiro et al. | 451/526 |
| 6,984,163 B2 | 1/2006 | Roberts | |
| 7,018,581 B2 | 3/2006 | David et al. | |
| 7,195,539 B2 | 3/2007 | Turner et al. | |
| 7,258,602 B2 | 8/2007 | Shih et al. | |
| 7,874,894 B2 | 1/2011 | Fukuda et al. | |
| 7,927,183 B2 | 4/2011 | Fukuda et al. | |
| 8,257,544 B2 | 9/2012 | Kulp et al. | |
| 8,257,545 B2 | 9/2012 | Loyack et al. | |
| 8,431,489 B2 | 4/2013 | Kulp et al. | |
| 8,512,427 B2 | 8/2013 | Xie et al. | |
| 8,980,749 B1 * | 3/2015 | Itai et al. | 438/692 |
| 9,064,806 B1 * | 6/2015 | Qian et al. | |
| 2003/0171081 A1 | 9/2003 | Komukai et al. | |
| 2006/0037699 A1 * | 2/2006 | Nakamori et al. | 156/345.12 |
| 2006/0276109 A1 * | 12/2006 | Roy et al. | 451/41 |
| 2008/0207100 A1 * | 8/2008 | Roy et al. | 451/529 |
| 2009/0053976 A1 * | 2/2009 | Roy et al. | 451/36 |
| 2009/0093202 A1 * | 4/2009 | Fukuda et al. | 451/533 |
| 2009/0253353 A1 * | 10/2009 | Ogawa et al. | 451/41 |
| 2010/0099344 A1 * | 4/2010 | String et al. | 451/533 |
| 2010/0162631 A1 * | 7/2010 | Sato et al. | 51/295 |
| 2010/0227533 A1 * | 9/2010 | Kulp et al. | 451/41 |
| 2010/0317261 A1 * | 12/2010 | Kulp et al. | 451/41 |
| 2011/0177758 A1 * | 7/2011 | Loyack et al. | 451/6 |
| 2012/0077418 A1 * | 3/2012 | Loyack et al. | 451/6 |
| 2014/0120809 A1 * | 5/2014 | Qian et al. | 451/59 |
| 2014/0256225 A1 * | 9/2014 | Repper et al. | 451/6 |
| 2014/0256226 A1 * | 9/2014 | Repper et al. | 451/6 |
| 2014/0256230 A1 * | 9/2014 | Repper et al. | 451/41 |
| 2014/0256231 A1 * | 9/2014 | Repper et al. | 451/41 |
| 2014/0256232 A1 * | 9/2014 | Repper et al. | 451/41 |
| 2014/0357163 A1 * | 12/2014 | Murnane et al. | 451/56 |
| 2014/0357169 A1 * | 12/2014 | Murnane et al. | 451/527 |
| 2014/0357170 A1 * | 12/2014 | Qian et al. | 451/527 |
| 2015/0065013 A1 * | 3/2015 | Jensen et al. | 451/41 |
| 2015/0065014 A1 * | 3/2015 | Jensen et al. | 451/41 |

OTHER PUBLICATIONS

Copending U.S. Appl. No. 14/228,744.
Copending U.S. Appl. No. 13/906,715.
Copending U.S. Appl. No. 13/906,765.
Copending U.S. Appl. No. 13/906,825.

* cited by examiner

*Primary Examiner* — Allan Olsen
(74) *Attorney, Agent, or Firm* — Thomas S. Deibert

(57) ABSTRACT

A chemical mechanical polishing pad is providing containing a polishing layer having a polishing surface; and, an endpoint detection window; wherein the endpoint detection window comprises a reaction product of ingredients, comprising: an isocyanate terminated urethane prepolymer having 2 to 6.5 wt % unreacted NCO groups; and, a curative system, comprising: at least 5 wt % of a difunctional curative; at least 5 wt % of an amine initiated polyol curative having at least one nitrogen atom per molecule and an average of at least three hydroxyl groups per molecule; and, 25 to 90 wt % of a high molecular weight polyol curative having a number average molecular weight, $M_N$, of 2,000 to 100,000 and an average of 3 to 10 hydroxyl groups per molecule. Also provide are methods of making and using the chemical mechanical polishing pad.

10 Claims, No Drawings

CHEMICAL MECHANICAL POLISHING PAD WITH ENDPOINT DETECTION WINDOW

The present invention relates to a chemical mechanical polishing pad with an endpoint detection window. The present invention is also directed to a method of chemical mechanical polishing of a substrate using a chemical mechanical polishing pad with an endpoint detection window.

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials may be deposited by a number of deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing medium (e.g., slurry) is provided between the wafer and the polishing pad. Thus, the wafer surface is polished and made planar by the chemical and mechanical action of the pad surface and the polishing medium.

One challenge presented with chemical mechanical polishing is determining when the substrate has been polished to the desired extent. In situ methods for determining polishing endpoints have been developed. The in situ optical end pointing techniques can be divided into two basic categories: (1) monitoring the reflected optical signal at a single wavelength or (2) monitoring the reflected optical signal from multiple wavelengths. Typical wavelengths used for optical end pointing include those in the visible spectrum (e.g., 400 to 700 nm), the ultraviolet spectrum (315 to 400 nm), and the infrared spectrum (e.g., 700 to 1000 nm). In U.S. Pat. No. 5,433,651, Lustig et al disclosed a polymeric endpoint detection method using a single wavelength in which light from a laser source is transmitted on a wafer surface and the reflected signal is monitored. As the composition at the wafer surface changes from one metal to another, the reflectivity changes. This change in reflectivity is then used to detect the polishing endpoint. In U.S. Pat. No. 6,106,662, Bibby et al disclosed using a spectrometer to acquire an intensity spectrum of reflected light in the visible range of the optical spectrum. In metal CMP applications, Bibby et al. teach using the whole spectrum to detect the polishing endpoint.

To accommodate these optical end pointing techniques, chemical mechanical polishing pads have been developed having windows. For example, in U.S. Pat. No. 5,605,760, Roberts discloses a polishing pad wherein at least a portion of the pad is transparent to laser light over a range of wavelengths. In some of the disclosed embodiments, Roberts teaches a polishing pad that includes a transparent window piece in an otherwise opaque pad. The window piece may be a rod or plug of transparent polymer in a molded polishing pad. The rod or plug may be insert molded within the polishing pad (i.e., an "integral window"), or may be installed into a cut out in the polishing pad after the molding operation (i.e., a "plug in place window").

Aliphatic isocyanate based polyurethane materials, such as those described in U.S. Pat. No. 6,984,163 provided improved light transmission over a broad light spectrum. Unfortunately, these aliphatic polyurethane windows, inter alia, tend to lack the requisite durability required for demanding polishing applications.

Conventional polymer based endpoint detection windows often exhibit undesirable degradation upon exposure to light having a wavelength of 330 to 425 nm. Increasingly, however, there is pressure to utilize light with shorter wavelengths for endpoint detection purposes in semiconductor polishing applications to facilitate thinner material layers and smaller device sizes.

In addition, semiconductor devices are becoming increasingly complex with finer features and more metallization layers. This trend requires improved performance from polishing consumables in order to maintain planarity and limit polishing defects. The latter can create electrical breaks or shorts of the conducting lines that would render the semiconductor device non-functional. It is generally known that one approach to reduce polishing defects, such as micro-scratches or chatter marks, is to use a softer polishing layer material. Accordingly, there is a trend toward using softer polishing layer materials to facilitate improved defectivity performance. Notwithstanding, conventional window formulations do not pair well with such softer polishing layer materials, tending to lead to an increase in polishing defectivity.

Accordingly, there is a continuing need for improved polymeric endpoint detection window formulations for use in chemical mechanical polishing pads. In particular, there is a continuing need for polymeric endpoint detection window formulations exhibiting a hardness of ≤50 Shore D, coupled with an elongation to break of ≤400%; wherein the window formulations do not exhibit undesirable window deformation and have the required durability for demanding polishing applications.

The present invention provides a chemical mechanical polishing pad, comprising: a polishing layer having a polishing surface; and, an endpoint detection window; wherein the endpoint detection window comprises a reaction product of ingredients, comprising: an isocyanate terminated urethane prepolymer having 2 to 6.5 wt % unreacted NCO groups; and, a curative system, comprising: at least 5 wt % of a difunctional curative; at least 5 wt % of an amine initiated polyol curative having at least one nitrogen atom per molecule and an average of at least three hydroxyl groups per molecule; and, 25 to 90 wt % of a high molecular weight polyol curative having a number average molecular weight, $M_N$, of 2,000 to 100,000 and an average of 3 to 10 hydroxyl groups per molecule.

The present invention provides a chemical mechanical polishing pad, comprising: a polishing layer having a polishing surface; and, an endpoint detection window; wherein the endpoint detection window comprises a reaction product of ingredients, comprising: an isocyanate terminated urethane prepolymer having 2 to 6.5 wt % unreacted NCO groups; and, a curative system, comprising: at least 5 wt % of a difunctional curative; at least 5 wt % of an amine initiated polyol curative having at least one nitrogen atom per molecule and an average of at least three hydroxyl groups per molecule; and, 25 to 90 wt % of a high molecular weight polyol curative having a number average molecular weight, $M_N$, of 2,000 to 100,000 and an average of 3 to 10 hydroxyl groups per molecule; wherein the polishing surface is adapted for polishing a substrate selected from the group consisting of at least one of a magnetic substrate, an optical substrate and a semiconductor substrate.

The present invention provides a chemical mechanical polishing pad, comprising: a polishing layer having a polishing surface; and, an endpoint detection window; wherein the endpoint detection window comprises a reaction product of ingredients, comprising: an isocyanate terminated urethane prepolymer having 2 to 6.5 wt % unreacted NCO groups; and, a curative system, comprising: at least 5 wt % of a difunctional curative; at least 5 wt % of an amine initiated polyol curative having at least one nitrogen atom per molecule and an average of at least three hydroxyl groups per molecule; and, 25 to 90 wt % of a high molecular weight polyol curative having a number average molecular weight, $M_N$, of 2,000 to 100,000 and an average of 3 to 10 hydroxyl groups per molecule; wherein the curative system has a plurality of reactive hydrogen groups and the isocyanate terminated urethane prepolymer has a plurality of unreacted NCO groups; and, wherein a stoichiometric ratio of the reactive hydrogen groups to the unreacted NCO groups is 0.7 to 1.2.

The present invention provides a chemical mechanical polishing pad, comprising: a polishing layer having a polishing surface; and, an endpoint detection window; wherein the endpoint detection window comprises a reaction product of ingredients, comprising: an isocyanate terminated urethane prepolymer having 2 to 6.5 wt % unreacted NCO groups; and, a curative system, comprising: at least 5 wt % of a difunctional curative; at least 5 wt % of an amine initiated polyol curative having at least one nitrogen atom per molecule and an average of at least three hydroxyl groups per molecule; and, 25 to 90 wt % of a high molecular weight polyol curative having a number average molecular weight, $M_N$, of 2,000 to 100,000 and an average of 3 to 10 hydroxyl groups per molecule; wherein the endpoint detection window exhibits a density of $\geq 1$ g/cm$^3$; a porosity of less than 0.1 vol %; a Shore D hardness of 10 to 50; an elongation to break of $\leq 400\%$; and, a double pass transmission at 800 nm of 30 to 100%.

The present invention provides a chemical mechanical polishing pad, comprising: a polishing layer having a polishing surface; and, an endpoint detection window; wherein the endpoint detection window comprises a reaction product of ingredients, comprising: an isocyanate terminated urethane prepolymer having 2 to 6.5 wt % unreacted NCO groups; and, a curative system, comprising: at least 5 wt % of a difunctional curative; at least 5 wt % of an amine initiated polyol curative having at least one nitrogen atom per molecule and an average of at least three hydroxyl groups per molecule; and, 25 to 90 wt % of a high molecular weight polyol curative having a number average molecular weight, $M_N$, of 2,000 to 100,000 and an average of 3 to 10 hydroxyl groups per molecule; wherein the endpoint detection window exhibits a density of $\geq 1$ g/cm$^3$; a porosity of less than 0.1 vol %; a Shore D hardness of 10 to 50; an elongation to break of $\leq 400\%$; a double pass transmission at 800 nm of 30 to 100%; and, a double pass transmission at 400 nm of 25 to 100%.

The present invention provides a method of making a chemical mechanical polishing pad of the present invention, comprising: providing a polishing layer having a polishing surface; providing an isocyanate terminated urethane prepolymer having 2 to 6.5 wt % unreacted NCO groups; providing a curative system, comprising: at least 5 wt % of a difunctional aromatic curative; at least 5 wt % of an amine initiated polyol curative having at least one nitrogen atom per molecule and an average of at least three hydroxyl groups per molecule; 25 to 90 wt % of a high molecular weight polyol curative having a number average molecular weight, $M_N$, of 2,000 to 100,000 and an average of 3 to 10 hydroxyl groups per molecule; combining the isocyanate terminated urethane prepolymer and the curative system to form a combination; allowing the combination to react to form a product; forming an endpoint detection window from the product; interfacing the endpoint detection window with the polishing layer to provide a chemical mechanical polishing pad.

The present invention provides a method of polishing a substrate, comprising: providing a chemical mechanical polishing apparatus having a platen, a light source and a photosensor; providing at least one substrate; providing a chemical mechanical polishing pad of the present invention; installing onto the platen the chemical mechanical polishing pad; optionally, providing a polishing medium at an interface between the polishing surface and the substrate; creating dynamic contact between the polishing surface and the substrate, wherein at least some material is removed from the substrate; and, determining a polishing endpoint by transmitting light from the light source through the endpoint detection window and analyzing the light reflected off the surface of the substrate back through the endpoint detection window incident upon the photosensor.

DETAILED DESCRIPTION

The chemical mechanical polishing pad of the present invention have an endpoint detection window comprising the reaction product of a unique set of ingredients, which reaction product exhibits a unique combination of low hardness (i.e., Shore D$\leq$50) to provide low defect polishing performance and a low tensile elongation (i.e., elongation to break $\leq 400\%$) coupled with good optical properties (i.e., a double pass transmission at 800 nm, $DPT_{800}$, of $\geq 30\%$) to facilitate polishing end point detection; wherein the endpoint detection window formulation does not exhibit undesirable window deformation (i.e., excessive bulging) and have the required durability for demanding polishing applications.

The term "polishing medium" as used herein and in the appended claims encompasses particle containing polishing solutions and non-particle-containing polishing solutions, such as abrasive free and reactive liquid polishing solutions.

The term "double pass transmission" or "DPT" as used herein and in the appended claims in reference to an endpoint detection window is determined using the following equation:

$$DPT=(IW_{Si}-IW_D)\div(IA_{Si}-IA_D)$$

wherein $IW_{Si}$, $IW_D$, $IA_{Si}$, and $IA_D$ are measured using a Verity SP2006 Spectral Interferometer including a SD1024F spectrograph, a xenon flash lamp and a 3 mm fiber optic cable by placing a light emitting surface of the 3 mm fiber optic cable against (and normal to) a first face of the endpoint detection window at a point of origin, directing light through the thickness, $T_W$, of the window and measuring at the point of origin the intensity of light reflected back through the thickness of the window, $T_W$, from a surface positioned against a second face of the endpoint detection window substantially parallel to the first face; wherein $IW_{Si}$ is a measurement of the intensity of light that passes through the window from the point of origin and reflects off the surface of a silicon blanket wafer placed against a second face of the window back through the window to the point of origin; wherein $IW_D$ is a measurement of the intensity of light that passes from the point of origin through the window and reflects off the surface of a black body and back through the window to the point of origin; wherein $IA_{Si}$ is a measurement of the intensity of light that passes from the point of origin through a thickness of air equivalent to the thickness, $T_W$, of the endpoint detection window, reflects off the surface of a silicon blanket wafer placed normal to the light emitting surface of the 3 mm fiber optic cable and reflects back through the thickness of air to the point of origin; and, wherein $IA_D$ is a measurement of the intensity of light reflected off a black body at the light emitting surface of the 3 mm fiber optic cable.

The term "$DPT_{400}$" as used herein and in the appended claims is the DPT exhibited by an endpoint detection window for light having a wavelength of 400 nm.

The term "$DPT_{800}$" as used herein and in the appended claims is the DPT exhibited by an endpoint detection window for light having a wavelength of 800 nm.

The chemical mechanical polishing pad of the present invention, comprises: a polishing layer having a polishing surface; and, an endpoint detection window; wherein the endpoint detection window comprises a reaction product of ingredients, comprising: an isocyanate terminated urethane prepolymer having 2 to 6.5 wt % (preferably, 3 to 6 wt %; more preferably, 5 to 6 wt %; most preferably, 5.5 to 6 wt %) unreacted NCO groups; and, a curative system, comprising: at least 5 wt % (preferably, 5 to 70 wt %; more preferably, 10 to 60 wt %; most preferably, 20 to 40 wt %) of a difunctional curative; at least 5 wt % (preferably, 5 to 25 wt %; more preferably, 5 to 20 wt %; most preferably, 5 to 15 wt %) of an amine initiated polyol curative having at least one nitrogen atom (preferably, one to four nitrogen atoms; more preferably, two to four nitrogen atoms; most preferably, two nitrogen atoms) per molecule and an average of at least three (preferably, three to six; more preferably, three to five; most preferably, four) hydroxyl groups per molecule; and, 25 to 90 wt % (preferably, 35 to 90 wt %; more preferably, 40 to 75 wt %; most preferably, 50 to 65 wt %) of a high molecular weight polyol curative having a number average molecular weight, $M_N$, of 2,000 to 100,000 (preferably 2,500 to 100,000; more preferably 5,000 to 50,000; most preferably 7,500 to 15,000) and an average of three to ten (preferably, four to eight; more preferably, five to seven; most preferably, six) hydroxyl groups per molecule.

The polishing layer of the chemical mechanical polishing pad of the present invention has a polishing surface adapted for polishing a substrate. Preferably, the polishing surface is adapted for polishing a substrate selected from at least one of a magnetic substrate, an optical substrate and a semiconductor substrate. More preferably, the polishing surface is adapted for polishing a semiconductor substrate.

Preferably, the polishing surface has macrotexture selected from at least one of perforations and grooves. Perforations can extend from the polishing surface part way or all the way through the thickness of the polishing layer. Preferably, grooves are arranged on the polishing surface such that upon rotation of the chemical mechanical polishing pad during polishing, at least one groove sweeps over the surface of the substrate being polished. Preferably, the polishing surface has macrotexture including at least one groove selected from the group consisting of curved grooves, linear grooves and combinations thereof Preferably, polishing layer of the chemical mechanical polishing pad of the present invention has a polishing surface adapted for polishing the substrate, wherein the polishing surface has a macrotexture comprising a groove pattern formed therein. Preferably, the groove pattern comprises a plurality of grooves. More preferably, the groove pattern is selected from a groove design. Preferably, the groove design is selected from the group consisting of concentric grooves (which may be circular or spiral), curved grooves, cross hatch grooves (e.g., arranged as an X-Y grid across the pad surface), other regular designs (e.g., hexagons, triangles), tire tread type patterns, irregular designs (e.g., fractal patterns), and combinations thereof. More preferably, the groove design is selected from the group consisting of random grooves, concentric grooves, spiral grooves, cross-hatched grooves, X-Y grid grooves, hexagonal grooves, triangular grooves, fractal grooves and combinations thereof. Most preferably, the polishing surface has a spiral groove pattern formed therein. The groove profile is preferably selected from rectangular with straight side walls or the groove cross section may be "V" shaped, "U" shaped, saw tooth, and combinations thereof.

The isocyanate terminated urethane prepolymer used in the formation of the endpoint detection window of the chemical mechanical polishing pad of the present invention preferably comprises: a reaction product of ingredients, comprising: a polyfunctional isocyanate and a prepolymer polyol.

Polyfunctional isocyanate used in the preparation of the isocyanate terminated urethane prepolymer is preferably selected from the group consisting of aliphatic polyfunctional isocyanates, aromatic polyfunctional isocyanates, and mixtures thereof. More preferably, the polyfunctional isocyanate used is a diisocyanate selected from the group consisting of 2,4-toluene diisocyanate; 2,6-toluene diisocyanate; 4,4'-diphenylmethane diisocyanate; naphthalene-1,5-diisocyanate; tolidine diisocyanate; para-phenylene diisocyanate; xylylene diisocyanate; isophorone diisocyanate; hexamethylene diisocyanate; 4,4'-dicyclohexylmethane diisocyanate; cyclohexanediisocyanate; and, mixtures thereof. Most preferably, the polyfunctional isocyanate used is a diisocyanate selected from the group consisting of 2,4-toluene diisocyanate; 2,6-toluene diisocyanate; and, mixtures thereof Prepolymer polyol used in the preparation of the isocyanate terminated urethane prepolymer is preferably selected from the group consisting of diols, polyols, polyol diols, copolymers thereof, and mixtures thereof. More preferably, the prepolymer polyol is selected from the group consisting of polyether polyols (e.g., poly(oxytetramethylene)glycol, poly(oxypropylene)glycol, poly(oxyethylene)glycol); polycarbonate polyols; polyester polyols; polycaprolactone polyols; mixtures thereof; and, mixtures thereof with one or more low molecular weight polyols selected from the group consisting of ethylene glycol; 1,2-propylene glycol; 1,3-propylene glycol; 1,2-butanediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; dipropylene glycol; and, tripropylene glycol. Still more preferably, the prepolymer polyol is selected from the group consisting of at least one of polytetramethylene ether glycol (PTMEG); polypropylene ether glycols (PPG), and polyethylene ether glycols (PEG); optionally, mixed with at least one low molecular weight polyol selected from the group consisting of ethylene glycol; 1,2-propylene glycol; 1,3-propylene glycol; 1,2-butanediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; dipropylene glycol; and, tripropylene glycol. Most preferably, the prepolymer polyol includes PPG mixed with at least one of ethylene glycol; 1,2-propylene glycol; 1,3-propylene glycol; 1,2-butanediol; 1,3-butanediol; 2-methyl-1,3-propanediol; 1,4-butanediol; neopentyl glycol;

1,5-pentanediol; 3-methyl-1,5-pentanediol; 1,6-hexanediol; diethylene glycol; dipropylene glycol; and, tripropylene glycol.

The isocyanate terminated urethane prepolymer used in the formation of the endpoint detection window of the chemical mechanical polishing pad of the present invention preferably contains an average of two reactive isocyanate groups (i.e., NCO) per molecule.

The isocyanate terminated urethane prepolymer used in the formation of the endpoint detection window of the chemical mechanical polishing pad of the present invention has 2 to 6.5 wt % (preferably, 3 to 6 wt %; more preferably, 5 to 6 wt %; most preferably, 5.5 to 6 wt %) unreacted NCO groups.

The isocyanate terminated urethane prepolymer used in the formation of the endpoint detection window of the chemical mechanical polishing pad of the present invention is preferably a low free isocyanate terminated urethane prepolymer having less than 0.1 wt % free toluene diisocyanate (TDI) monomer content.

Examples of commercially available PTMEG based isocyanate terminated urethane prepolymers include Imuthane® prepolymers (available from COIM USA, Inc., such as, PET-80A, PET-85A, PET-90A, PET-93A, PET-95A, PET-60D, PET-70D, PET-75D); Adiprene® prepolymers (available from Chemtura, such as, LF 800A, LF 900A, LF 910A, LF 930A, LF 931A, LF 939A, LF 950A, LF 952A, LF 600D, LF 601D, LF 650D, LF 667, LF 700D, LF750D, LF751D, LF752D, LF753D and L325); Andur® prepolymers (available from Anderson Development Company, such as, 70APLF, 80APLF, 85APLF, 90APLF, 95APLF, 60DPLF, 70APLF, 75APLF).

Examples of commercially available PPG based isocyanate terminated urethane prepolymers include Imuthane® prepolymers (available from COIM USA, Inc., such as, PPT-80A, PPT-90A, PPT-95A, PPT-65D, PPT-75D); Adiprene® prepolymers (available from Chemtura, such as, LFG 963A, LFG 964A, LFG 740D); and, Andur® prepolymers (available from Anderson Development Company, such as, 8000APLF, 9500APLF, 6500DPLF, 7501DPLF).

Non-TDI based isocyanate terminated urethane prepolymers can also be used. For example, isocyanate terminated urethane prepolymers include those formed by the reaction of 4,4'-diphenylmethane diisocyanate (MDI) and polyols such as polytetramethylene glycol (PTMEG) with optional diols such as 1,4-butanediol (BDO) are acceptable. When such isocyanate terminated urethane prepolymers are used, the unreacted isocyanate (NCO) concentration is preferably 4 to 10 wt % (more preferably 4 to 8 wt %, most preferably 5 to 7 wt %). Examples of commercially available isocyanate terminated urethane prepolymers in this category include Imuthane® prepolymers (available from COIM USA, Inc. such as 27-85A, 27-90A, 27-95A); Andur® prepolymers (available from Anderson Development Company, such as, IE75AP, IE80AP, IE 85AP, IE90AP, IE95AP, IE98AP); and, Vibrathane® prepolymers (available from Chemtura, such as, B625, B635, B821).

The difunctional curative used in the formation of the endpoint detection window of the chemical mechanical polishing pad of the present invention, is preferably selected from diols and diamines. More preferably, the difunctional curative is a difunctional aromatic curative selected from the group consisting of diethyltoluenediamine (DETDA); 3,5-dimethylthio-2,4-toluenediamine and isomers thereof; 3,5-diethyltoluene-2,4-diamine and isomers thereof (e.g., 3,5-diethyltoluene-2,6-diamine); 4,4'-bis-(sec-butylamino)-diphenylmethane; 1,4-bis-(sec-butylamino)-benzene; 4,4'-methylene-bis-(2-chloroaniline); 4,4'-methylene-bis-(3-chloro-2,6-diethylaniline) (MCDEA); polytetramethyleneoxide-di-p-aminobenzoate; N,N'-dialkyl-diamino diphenyl methane; p,p'-methylene dianiline (MDA); m-phenylenediamine (MPDA); 4,4'-methylene-bis-(2-chloroaniline) (MBOCA); 4,4'-methylene-bis-(2,6-diethylaniline) (MDEA); 4,4'-methylene-bis-(2,3-dichloroaniline) (MDCA); 4,4'-diamino-3,3'-diethyl-5,5'-dimethyl diphenylmethane, 2,2',3,3'-tetrachloro diamino diphenylmethane; trimethylene glycol di-p-aminobenzoate; and mixtures thereof. Still more preferably, the difunctional aromatic curative used is selected from the group consisting of 4,4'-methylene-bis-(2-chloroaniline) (MBOCA); 4,4'-methylene-bis-(3-chloro-2,6-diethylaniline) (MCDEA); and, isomers thereof. Most preferably, the difunctional aromatic curative used is 4,4'-methylene-bis-(2-chloroaniline) (MBOCA).

The amine initiated polyol curative used in the formation of the endpoint detection window of the chemical mechanical polishing pad of the present invention, contains at least one nitrogen atom (preferably, one to four nitrogen atoms; more preferably, two to four nitrogen atoms; most preferably, two nitrogen atoms) per molecule and an average of at least three (preferably, three to six; more preferably, three to five; most preferably, four) hydroxyl groups per molecule. Preferably, the amine initiated polyol curative used in the formation of the endpoint detection window of the chemical mechanical polishing pad of the present invention has a number average molecular weight, $M_N$, of ≤700 (more preferably, 150 to 650; still more preferably, 200 to 500; most preferably, 250 to 300).

The amine initiated polyol curative used in the formation of the endpoint detection window of the chemical mechanical polishing pad of the present invention preferably has a hydroxyl number (as determined by ASTM Test Method D4274-11) of 350 to 1,200 mg KOH/g (more preferably, 400 to 1,000 mg KOH/g; most preferably, 600 to 850 mg KOH/g). Examples of commercially available amine initiated polyol curatives include the Voranol® family of amine initiated polyols (available from The Dow Chemical Company); the Quadrol® Specialty Polyols (N,N,N',N'-tetrakis (2-hydroxypropyl ethylene diamine))(available from BASF); Pluracol® amine based polyols (available from BASF); Multranol® amine based polyols (available from Bayer MaterialScience LLC); triisopropanolamine (TIPA) (available from The Dow Chemical Company); and, triethanolamine (TEA) (available from Mallinckrodt Baker Inc.). A number of preferred amine initiated polyol curatives are listed in TABLE 1.

TABLE 1

| Amine initiated polyol curative | Number of OH groups per molecule | $M_N$ | Hydroxyl Number (mg KOH/g) |
|---|---|---|---|
| Triethanolamine | 3 | 149 | 1130 |
| Triisopropanolamine | 3 | 192 | 877 |
| MULTRANOL ® 9138 Polyol | 3 | 240 | 700 |
| MULTRANOL ® 9170 Polyol | 3 | 481 | 350 |
| VORANOL ® 391 Polyol | 4 | 568 | 391 |
| VORANOL ® 640 Polyol | 4 | 352 | 638 |
| VORANOL ® 800 Polyol | 4 | 280 | 801 |
| QUADROL ® Polyol | 4 | 292 | 770 |
| MULTRANOL ® 4050 Polyol | 4 | 356 | 630 |
| MULTRANOL ® 4063 Polyol | 4 | 488 | 460 |
| MULTRANOL ® 8114 Polyol | 4 | 568 | 395 |
| MULTRANOL ® 8120 Polyol | 4 | 623 | 360 |
| MULTRANOL ® 9181 Polyol | 4 | 291 | 770 |
| VORANOL ® 202 Polyol | 5 | 590 | 475 |

Without wishing to be bound by theory, in addition to promoting the desired balance of physical properties in the endpoint detection window produced therewith, it is believed that the concentration of the amine initiated polyol curative used in the curative system also acts to auto catalyze its reaction and the reaction of any difunctional curative in the curative system with the unreacted isocyanate (NCO) groups present in the isocyanate terminated urethane prepolymer.

The high molecular weight polyol curative used in the formation of the endpoint detection window of the chemical mechanical polishing pad of the present invention preferably has a number average molecular weight, $M_N$, of 2,000 to 100,000 (more preferably, 2,500 to 100,000; still more preferably 5,000 to 50,000; most preferably, 7,500 to 15,000).

The high molecular weight polyol curative used in the formation of the endpoint detection window of the chemical mechanical polishing pad of the present invention preferably has an average of three to ten (more preferably, four to eight; still more preferably, five to seven; most preferably, six) hydroxyl groups per molecule.

The high molecular weight polyol curative used in the formation of the endpoint detection window of the chemical mechanical polishing pad of the present invention preferably has a number average molecular weight, $M_N$, that is higher than the number average molecular weight, $M_N$, of the amine initiated polyol curative used in the curative system; and, has a hydroxyl number that is lower than the hydroxyl number of the amine initiated curative used in the curative system.

Examples of commercially available high molecular weight polyol curatives include Specflex® polyols, Voranol® polyols and Voralux® polyols (available from The Dow Chemical Company); Multranol® Specialty Polyols and Ultracel® Flexible Polyols (available from Bayer MaterialScience LLC); and Pluracol® Polyols (available from BASF). A number of preferred high molecular weight polyol curatives are listed in TABLE 2.

TABLE 2

| High molecular weight polyol curative | Number of OH groups per molecule | $M_N$ | Hydroxyl Number (mg KOH/g) |
|---|---|---|---|
| Multranol ® 3901 Polyol | 3.0 | 6,000 | 28 |
| Pluracol ® 1385 Polyol | 3.0 | 3,200 | 50 |
| Pluracol ® 380 Polyol | 3.0 | 6,500 | 25 |
| Pluracol ® 1123 Polyol | 3.0 | 7,000 | 24 |
| ULTRACEL ® 3000 Polyol | 4.0 | 7,500 | 30 |
| SPECFLEX ® NC630 Polyol | 4.2 | 7,602 | 31 |
| SPECFLEX ® NC632 Polyol | 4.7 | 8,225 | 32 |
| VORALUX ® HF 505 Polyol | 6.0 | 11,400 | 30 |
| MULTRANOL ® 9185 Polyol | 6.0 | 3,366 | 100 |
| VORANOL ® 4053 Polyol | 6.9 | 12,420 | 31 |

The sum of the reactive hydrogen groups (i.e., the sum of the amine ($NH_2$) groups and the hydroxyl (OH) groups) contained in the components of the curative system divided by the unreacted isocyanate (NCO) groups in the isocyanate terminated urethane prepolymer (i.e., the stoichiometric ratio) used in the formation of the endpoint detection window of the chemical mechanical polishing pad of the present invention is preferably 0.7 to 1.2 (preferably, 0.8 to 1.10; more preferably, 0.95 to 1.05; most preferably, 0.98 to 1.02).

The endpoint detection window of the chemical mechanical polishing pad of the present invention preferably exhibits a density of $\geq 1$ g/cm$^3$ (preferably, 1.05 to 1.2 g/cm$^3$; more preferably 1.1 to 1.2 g/cm$^3$; most preferably 1.1 to 1.15 g/cm$^3$); a porosity of less than 0.1 vol %; a Shore D hardness of 10 to 50 (preferably, 15 to 45; more preferably, 20 to 40; most preferably, 25 to 35); and, an elongation to break of $\leq 400\%$ (preferably, 150 to 400%; more preferably, 200 to 400%; most preferably, 250 to 400%).

The endpoint detection window of the chemical mechanical polishing pad of the present invention preferably exhibits a double pass transmission at 800 nm, $DPT_{800}$, of 30 to 100% (preferably, of 30 to 85%; more preferably, 50 to 85%; most preferably, 60 to 80%) as measured under the conditions set forth herein in the Examples. Preferably, the endpoint detection window of the chemical mechanical polishing pad of the present invention exhibits a $DPT_{800}$ of 30 to 100% (preferably, of 30 to 85%; more preferably, 50 to 85%; most preferably, 60 to 85%) as measured under the conditions set forth herein in the Examples; and, a double pass transmission at 400 nm, $DPT_{400}$, of 25 to 100% (preferably, of 25 to 85%; more preferably, 40 to 85%; most preferably, 45 to 85%) as measured under the conditions set forth herein in the Examples.

The chemical mechanical polishing pad of the present invention is preferably adapted to be interfaced with a platen of a polishing machine. Preferably, the chemical mechanical polishing pad is adapted to be affixed to the platen of the polishing machine. Preferably, the chemical mechanical polishing pad can be affixed to the platen using at least one of a pressure sensitive adhesive and vacuum. Preferably, the chemical mechanical polishing pad of the present invention further comprises a pressure sensitive platen adhesive to facilitate affixing to the platen. One of ordinary skill in the art will know how to select an appropriate pressure sensitive adhesive for use as the pressure sensitive platen adhesive. Preferably, the chemical mechanical polishing pad of the present invention will also include a release liner applied over the pressure sensitive platen adhesive.

The chemical mechanical polishing pad of the present invention optionally further comprises at least one additional layer interfaced with the polishing layer.

The method of making a chemical mechanical polishing pad of the present invention, comprises: providing a polishing layer having a polishing surface; providing an isocyanate terminated urethane prepolymer having 2 to 6.5 wt % (preferably, 3 to 6 wt %; more preferably, 5 to 6 wt %; most preferably, 5.5 to 6 wt %) unreacted NCO groups; providing a curative system, comprising: at least 5 wt % (preferably, 5 to 70 wt %; more preferably, 10 to 60 wt %; most preferably, 20 to 40 wt %) of a difunctional curative; at least 5 wt % (preferably, 5 to 25 wt %; more preferably, 5 to 20 wt %; most preferably, 5 to 15 wt %) of an amine initiated polyol curative having at least one nitrogen atom (preferably, one to four nitrogen atoms; more preferably, two to four nitrogen atoms; most preferably, two nitrogen atoms) per molecule and an average of at least three (preferably, three to six; more preferably, three to five; most preferably, four) hydroxyl groups per molecule; and, 25 to 90 wt % (preferably, 35 to 90 wt %; more preferably, 40 to 75 wt %; most preferably, 50 to 65 wt %) of a high molecular weight polyol curative having a number average molecular weight, $M_N$, of 2,000 to 100,000 (preferably 2,500 to 100,000; more preferably 5,000 to 50,000; most preferably 7,500 to 15,000) and an average of three to ten (preferably, four to eight; more preferably, five to seven; most preferably, six) hydroxyl groups per molecule; combining the isocyanate terminated urethane prepolymer and the curative system to form a combination; allowing the combination to react to form a product; forming an endpoint detection window from the product; interfacing the endpoint detection window with the polishing layer to provide a chemical mechanical polishing pad. Preferably, the endpoint detection window is interfaced with the polishing layer as an integral window incorporated into the polishing layer using known techniques or as a plug in place window incorporated into the chemical mechanical polishing pad using known techniques. Most preferably, the endpoint detection window is incorporated into the polishing layer as an integral window.

An important step in substrate polishing operations is determining an endpoint to the process. One popular in situ method for endpoint detection involves providing a polishing pad with a window, which is transparent to select wavelengths of light. During polishing, a light beam is directed through the window to the wafer surface, where it reflects and passes back through the window to a detector (e.g., a spectrophotometer). Based on the return signal, properties of the substrate surface (e.g., the thickness of films thereon) can be determined for endpoint detection. To facilitate such light based endpoint methods, the chemical mechanical polishing pad of the present invention, comprises an endpoint detection window. Preferably, the endpoint detection window is selected from an integral window incorporated into the polishing layer; and, a plug in place endpoint detection window block incorporated into the chemical mechanical polishing pad. One of ordinary skill in the art will know to select an appropriate method for incorporating the endpoint detection window into the chemical mechanical polishing pad.

The method of the present invention for chemical mechanical polishing of a substrate comprises: providing a chemical mechanical polishing apparatus having a platen, a light source and a photosensor (preferably a multisensor spectrograph); providing at least one substrate to be polished (preferably, wherein the substrate is selected from the group consisting of at least one of a magnetic substrate, an optical substrate and a semiconductor substrate; more preferable, wherein the substrate is a semiconductor substrate; most preferably, wherein the substrate is a semiconductor wafer); providing a chemical mechanical polishing pad of the present invention; installing onto the platen the chemical mechanical polishing pad; optionally, providing a polishing medium at an interface between a polishing surface of the chemical mechanical polishing pad and the substrate (preferably, wherein the polishing medium is selected from the group consisting of a polishing slurry and a non-abrasive containing reactive liquid formulation); creating dynamic contact between the polishing surface and the substrate, wherein at least some material is removed from the substrate; and, determining a polishing endpoint by transmitting light from the light source through the endpoint detection window and analyzing the light reflected off the surface of the substrate back through the endpoint detection window incident upon the photosensor. Preferably, the polishing endpoint is determined based on an analysis of a wavelength of light reflected off the surface of the substrate and transmitted through the endpoint detection window, wherein the wavelength of light has a wavelength of >370 nm to 800 nm. More preferably, the polishing endpoint is determined based on an analysis of multiple wavelengths of light reflected off the surface of the substrate and transmitted through the endpoint detection window, wherein one of the wavelengths analyzed has a wavelength of >370 nm to 800 nm.

Some embodiments of the present invention will now be described in detail in the following Examples.

Comparative Examples C1-C23 and Examples 1-12

Endpoint detection windows were prepared according to the formulation details provided in TABLE 3. The window prepolymer was mixed with the components of the curative system using a vortex mixer at 1,000 rpm for 30 seconds. All of the raw materials, except for the difunctional curative (i.e., MBOCA and MCDEA), were maintained at a premixing temperature of 60° C. The MBOCA and MCDEA when used were maintained at a premixing temperature of 120° C.

The stoichiometric ratio between the window prepolymer and the curative system used for the endpoint detections windows is provided in TABLE 3 as the ratio of the reactive hydrogen groups (i.e., the sum of the —OH groups and —NH$_2$ groups) in the curative system to the unreacted isocyanate (NCO) groups in the isocyanate terminated urethane prepolymer.

In each of the Examples, the isocyanate terminated urethane prepolymer and the curative system were mixed together using a high shear mix head. After exiting the mix head, the combination was dispensed into a pocket mold with dimensions of 2 mm×125 mm×185 mm. The pocket mold with the dispensed combination was then cured in an oven for eighteen (18) hours. The set point temperature for the oven was initially set at 93° C. for the first twenty (20) minutes; 104° C. for the following fifteen (15) hours and forty (40) minutes; and then dropped to 21° C. for the final two (2) hours. The pocket mold and its contents was then removed the oven and the product endpoint detection window was then removed from the pocket mold.

TABLE 3

| | | | Curative System | | | | | | | | |
|---|---|---|---|---|---|---|---|---|---|---|---|
| Ex # | prepolymer | (% NCO) | aromatic curative (P1) | P1 (wt %) | High MW curative (P2) | P2 (wt %) | Amine initiated curative (P3) | P3 (wt %) | Non-amine curative (P4) | P4 (wt %) | Stoic. (Active H/NCO) |
| C1 | A | 6.67 | MbOCA | 14.20 | H | 73.41 | J | 12.39 | — | — | 1.0 |
| C2 | A | 6.67 | MbOCA | 12.39 | H | 75.22 | J | 12.39 | — | — | 1.0 |
| C3 | A | 6.70 | MbOCA | 14.16 | H | 73.49 | J | 12.35 | — | — | 1.0 |
| C4 | A | 6.70 | MbOCA | 33.33 | H | 57.25 | J | 9.42 | — | — | 1.0 |
| C5 | C | 8.88 | MbOCA | — | H | 85.62 | J | 14.38 | — | — | 1.0 |
| C6 | C | 8.88 | MbOCA | — | I | 85.78 | J | 14.22 | — | — | 1.0 |
| C7 | B | 5.72 | MbOCA | — | H | 85.84 | J | 14.16 | — | — | 1.0 |
| C8 | D | 8.94 | MbOCA | — | H | 85.68 | J | 14.32 | — | — | 1.0 |
| C9 | D | 8.94 | MbOCA | — | I | 85.82 | J | 14.18 | — | — | 1.0 |
| C10 | A | 6.67 | MCDEA | — | I | 85.59 | J | 14.41 | — | — | 1.0 |
| C11 | A | 6.70 | MbOCA | — | H | 85.68 | J | 14.32 | — | — | 1.0 |
| C12 | G | 4.15 | MbOCA | 100 | — | — | — | — | — | — | 1.0 |

TABLE 3-continued

| Ex # | prepolymer | (% NCO) | aromatic curative (P1) | P1 (wt %) | High MW curative (P2) | P2 (wt %) | Amine initiated curative (P3) | P3 (wt %) | Non-amine curative (P4) | P4 (wt %) | |
|---|---|---|---|---|---|---|---|---|---|---|---|
| C13 | B | 5.83 | MbOCA | 100 | — | — | — | — | — | — | 1.0 |
| C14 | E | 2.86 | MbOCA | 100 | — | — | — | — | — | — | 1.0 |
| C15 | F | 3.80 | MbOCA | 100 | — | — | — | — | — | — | 1.0 |
| C16 | B | 5.83 | MbOCA | 14.26 | H | 85.74 | — | — | — | — | 1.0 |
| C17 | B | 5.83 | MbOCA | 14.25 | I | 85.75 | — | — | — | — | 1.0 |
| C18 | B | 5.72 | MbOCA | 14.38 | H | 73.44 | — | — | K | 12.18 | 1.0 |
| C19 | B | 5.72 | MbOCA | 33.33 | H | 56.98 | — | — | K | 9.69 | 1.0 |
| C20 | A | 6.67 | MbOCA | 14.29 | H | 85.71 | — | — | — | — | 1.0 |
| C21 | A | 6.67 | MbOCA | 14.29 | I | 85.71 | — | — | — | — | 1.0 |
| C22 | A | 6.70 | MbOCA | 14.37 | H | 73.52 | — | — | K | 12.11 | 1.0 |
| C23 | A | 6.70 | MbOCA | 33.22 | H | 57.09 | — | — | K | 9.69 | 1.0 |
| 1 | B | 5.83 | MbOCA | 14.24 | H | 73.51 | J | 12.25 | — | — | 1.0 |
| 2 | B | 5.83 | MbOCA | 14.15 | H | 73.54 | J | 12.31 | — | — | 1.0 |
|   |   |   |   |   |   |   |   |   |   |   | Molar ratio (Active H/NCO) |
| 3 | B | 5.72 | MbOCA | 14.38 | H | 73.24 | J | 12.38 | — | — | 1.0 |
| 4 | B | 5.72 | MbOCA | 33.33 | H | 57.32 | J | 9.35 | — | — | 1.0 |
| 5 | B | 5.83 | MbOCA | 14.24 | H | 73.51 | J | 12.25 | — | — | 1.0 |
| 6 | B | 5.83 | MbOCA | 14.24 | H | 77.15 | J | 8.61 | — | — | 0.84 |
| 7 | B | 5.83 | MCDEA | 14.29 | H | 79.12 | J | 6.59 | — | — | 1.0 |
| 8 | B | 5.83 | MbOCA | 21.94 | H | 66.91 | J | 11.15 | — | — | 1.0 |
| 9 | B | 5.83 | MbOCA | 31.76 | H | 58.43 | J | 9.81 | — | — | 1.0 |
| 10 | B | 5.83 | MbOCA | 43.67 | H | 48.47 | J | 7.86 | — | — | 1.0 |
| 11 | B | 5.83 | MbOCA | 58.33 | H | 35.78 | J | 5.89 | — | — | 1.0 |
| 12 | B | 5.83 | MbOCA | 14.24 | H | 79.14 | J | 6.62 | — | — | 0.76 |

A is Adiprene ® LF667 isocyanate terminated urethane prepolymer comprising a 50/50 weight percent blend of Adiprene ® LF950A and Adiprene ® LF600D available from Chemtura.
B is Adiprene ® LFG963A isocyanate terminated urethane prepolymer available from Chemtura Corporation.
C is Adiprene ® LFG740D isocyanate terminated urethane prepolymer available from Chemtura Corporation.
D is Adiprene ® LFG750D isocyanate terminated urethane prepolymer available from Chemtura Corporation.
E is Adiprene ® LF800A isocyanate terminated urethane prepolymer available from Chemtura Corporation.
F is Adiprene ® LF900A isocyanate terminated urethane prepolymer available from Chemtura Corporation.
G is Vibrathane ® B628 polyether based TDI-terminated prepolymer available from Chemtura Corporation.
H is Voralux ® HF505 high molecular weight polyol curative having a number average molecular weight, $M_N$, of 11,400 and an average of six hydroxyl groups per molecule available from The Dow Chemical Company.
I is polytetramethylene ether glycol having a number average molecular weight, $M_N$, of 2000 and an average of two hydroxyl groups per molecule available from Sigma-Aldrich.
J is Voranol ® 800 amine initiated polyol curative having a number average molecular, $M_N$, of 280 and an average of four hydroxyl groups per molecule available from The Dow Chemical Company.
K is Voranol ® 230-660 non-amine containing polyol curative having a number average molecular, $M_N$, of 255 and an average of three hydroxyl groups per molecule available from The Dow Chemical Company.

The endpoint detection windows prepared according to each of Comparative Examples C1-C23 and Examples 1-12 were analyzed to determine the physical properties as reported in TABLE 4.

The $DPT_{400}$ and $DPT_{800}$ transmission data reported for the endpoint detection windows was determined using the following equation:

$$DPT = (IW_{Si} - IW_D) \div (IA_{Si} - IA_D)$$

wherein $IW_{Si}$, $IW_D$, $IA_{Si}$, and $IA_D$ are measured using a Verity SP2006 Spectral Interferometer including a SD1024F spectrograph, a xenon flash lamp and a 3 mm fiber optic cable by placing a light emitting surface of the 3 mm fiber optic cable against (and normal to) a first face of the endpoint detection window at a point of origin, directing light at a given wavelength (i.e., at 400 nm and 800 nm, respectively) through the thickness, $T_W$, of the window and measuring at the point of origin the intensity of light of the given wavelength reflected back through the thickness of the window, $T_W$, from a surface positioned against a second face of the endpoint detection window substantially parallel to the first face; wherein $IW_{Si}$ is a measurement of the intensity of light at the given wavelength that passes through the window from the point of origin and reflects off the surface of a silicon blanket wafer placed against a second face of the window back through the window to the point of origin; wherein $IW_D$ is a measurement of the intensity of light at the given wavelength that passes from the point of origin through the window and reflects off the surface of a black body and back through the window to the point of origin; wherein $IA_{Si}$ is a measurement of the intensity of light at the given wavelength that passes from the point of origin through a thickness of air equivalent to the thickness, $T_W$, of the endpoint detection window, reflects off the surface of a silicon blanket wafer placed normal to the light emitting surface of the 3 mm fiber optic cable and reflects back through the thickness of air to the point of origin; and, wherein $IA_D$ is a measurement of the intensity of light at the given wavelength reflected off a black body at the light emitting surface of the 3 mm fiber optic cable.

The density data reported for the endpoint detection windows was determined according to ASTM D1622.

The Shore D hardness data reported for the endpoint detection windows was determined according to ASTM D2240.

The tensile properties of the endpoint detection windows (i.e., tensile strength and elongation to break) were measured according to ASTM D1708-10 using an Alliance RT/5 mechanical tester available from MTS Systems Corporation as a crosshead speed of 2.54 cm/min. All tensile property testing was performed in a temperature and humidity controlled laboratory set at 23° C. and a relative humidity of 50%. All of the test samples were conditioned under the noted laboratory conditions for 5 days before performing the testing. The reported tensile strength (MPa) and elongation to break (%) for each endpoint detection window material were determined from stress-strain curves of four replicate samples.

TABLE 4

| | Properties | | | | |
|---|---|---|---|---|---|
| | DPT (in %) at | | Density | Shore D Hardness | Tensile strength | Elongation to break |
| Ex.# | 400 nm | 800 nm | (g/cm$^3$) | (15 s) | (MPa) | (%) |
| C1 | 0 | 0 | 1.11 | 17 | 8.38 | 426 |
| C2 | 0 | 0 | 1.10 | 24 | 8.56 | 279 |
| C3 | 2 | 1 | 1.09 | 6 | 3.55 | 287 |
| C4 | 0 | 18 | 1.08 | 22 | 9.78 | 306 |
| C5 | 0 | 0 | 1.07 | 10 | 2.81 | 131 |
| C6 | 0 | 0 | 1.08 | 14 | 6.70 | 223 |
| C7 | 16 | 41 | 1.08 | 14 | 2.48 | 160 |
| C8 | 0 | 0 | 1.11 | 12 | 6.02 | 199 |
| C9 | 0 | 0 | 1.07 | 10 | 8.18 | 345 |
| C10 | 0 | 9 | 1.06 | 17 | 2.17 | 146 |
| C11 | 1 | 0 | 1.07 | 6 | 2.91 | 262 |
| C12 | 38 | 68 | 1.13 | 32 | 18.68 | 807 |
| C13 | 8 | 64 | 1.13 | 55 | 24.94 | 492 |
| C14 | 48 | 70 | 1.06 | 28 | 12.22 | 768 |
| C15 | 26 | 53 | 1.08 | 38 | 27.32 | 860 |
| C16 | 0 | 0 | 1.10 | 24 | 7.58 | 362 |
| C17 | 0 | 0 | 1.07 | 9 | 1.82 | 145 |
| C18 | 0 | 4 | 1.10 | 23 | 6.30 | 284 |
| C19 | 0 | 31 | 1.11 | 32 | 12.22 | 404 |
| C20 | 0 | 0 | 1.08 | 29 | 8.96 | 337 |
| C21 | 0 | 0 | 1.07 | 14 | 2.89 | 517 |
| C22 | 0 | 10 | 1.09 | 28 | 7.08 | 247 |
| C23 | 0 | 8 | 1.09 | 36 | 15.08 | 353 |
| 1 | 55 | 70 | 1.12 | 21 | 6.30 | 242 |
| 2 | 38 | 61 | 1.07 | 26 | 6.63 | 196 |
| 3 | 44 | 70 | 1.10 | 15 | 5.19 | 281 |
| 4 | 37 | 66 | 1.10 | 25 | 11.05 | 390 |
| 5 | 42 | 59 | 1.11 | 24 | 7.21 | 248 |
| 6 | 25 | 68 | 1.12 | 29 | 6.98 | 152 |
| 7 | 50 | 61 | 1.13 | 23 | 6.88 | 243 |
| 8 | 51 | 70 | 1.11 | 28 | 6.30 | 255 |
| 9 | 50 | 75 | 1.12 | 34 | 9.77 | 328 |
| 10 | 47 | 74 | 1.13 | 38 | 12.98 | 379 |
| 11 | 32 | 68 | 1.13 | 42 | 14.50 | 356 |
| 12 | 22 | 54 | 1.12 | 28 | 5.79 | 146 |

We claim:

1. A chemical mechanical polishing pad, comprising:
a polishing layer having a polishing surface; and,
an endpoint detection window;
wherein the endpoint detection window comprises a reaction product of ingredients, comprising:
an isocyanate terminated urethane prepolymer having 2 to 6.5 wt % unreacted NCO groups; and,
a curative system, comprising:
at least 5 wt % of a difunctional curative;
at least 5 wt % of an amine initiated polyol curative having at least one nitrogen atom per molecule and an average of at least three hydroxyl groups per molecule; and,
25 to 90 wt % of a high molecular weight polyol curative having a number average molecular weight, $M_N$, of 2,000 to 100,000 and an average of 3 to 10 hydroxyl groups per molecule.

2. The chemical mechanical polishing pad of claim 1, wherein the polishing surface is adapted for polishing a substrate selected from the group consisting of at least one of a magnetic substrate, an optical substrate and a semiconductor substrate.

3. The chemical mechanical polishing pad of claim 2, wherein the polishing surface has a spiral groove pattern formed therein.

4. The chemical mechanical polishing pad of claim 1, wherein the curative system has a plurality of reactive hydrogen groups and the isocyanate terminated urethane prepolymer has a plurality of unreacted NCO groups; and, wherein a stoichiometric ratio of the reactive hydrogen groups to the unreacted NCO groups is 0.7 to 1.2.

5. The chemical mechanical polishing pad of claim 1, wherein the endpoint detection window exhibits a density of ≥1 g/cm$^3$; a porosity of less than 0.1 vol %; a Shore D hardness of 10 to 50; an elongation to break of ≤400%; and, a double pass transmission at 800 nm, $DPT_{800}$, of 30 to 100%.

6. The chemical mechanical polishing pad of claim 5, wherein the endpoint detection window also exhibits a double pass transmission at 400 nm, $DPT_{400}$, of 25 to 100%.

7. A method of making a chemical mechanical polishing pad according to claim 1, comprising:
providing a polishing layer having a polishing surface;
providing an isocyanate terminated urethane prepolymer having 2 to 6.5 wt % unreacted NCO groups;
providing a curative system, comprising:
at least 5 wt % of a difunctional aromatic curative;
at least 5 wt % of an amine initiated polyol curative having at least one nitrogen atom per molecule and an average of at least three hydroxyl groups per molecule;
25 to 90 wt % of a high molecular weight polyol curative having a number average molecular weight, $M_N$, of 2,000 to 100,000 and an average of 3 to 10 hydroxyl groups per molecule;
combining the isocyanate terminated urethane prepolymer and the curative system to form a combination;
allowing the combination to react to form a product;
forming an endpoint detection window from the product;
interfacing the endpoint detection window with the polishing layer to provide a chemical mechanical polishing pad.

8. The method of claim 7, wherein the endpoint detection window is an integral window.

9. A method of polishing a substrate, comprising:
providing a chemical mechanical polishing apparatus having a platen, a light source and a photosensor;
providing at least one substrate;
providing a chemical mechanical polishing pad according to claim 1;
installing onto the platen the chemical mechanical polishing pad;
optionally, providing a polishing medium at an interface between the polishing surface and the substrate;
creating dynamic contact between the polishing surface and the substrate, wherein at least some material is removed from the substrate; and,
determining a polishing endpoint by transmitting light from the light source through the endpoint detection window and analyzing the light reflected off the surface of the substrate back through the endpoint detection window incident upon the photosensor.

10. The method of claim 9, wherein the at least one substrate is selected from the group consisting of at least one of a magnetic substrate, an optical substrate and a semiconductor substrate.

* * * * *